United States Patent
Ray et al.

(10) Patent No.: US 7,081,322 B2
(45) Date of Patent: *Jul. 25, 2006

(54) NANOPASTES AS INK-JET COMPOSITIONS FOR PRINTING PLATES

(75) Inventors: Kevin Barry Ray, Fort Collins, CO (US); Ken-Ichi Shimazu, Briarcliff Manor, NY (US); Anthony Paul Kitson, Evans, CO (US)

(73) Assignee: Kodak Graphics Communications Canada Company, Barnaby (CA)

( * ) Notice: Subject to any disclaimer, the term of this patent is extended or adjusted under 35 U.S.C. 154(b) by 290 days.

This patent is subject to a terminal disclaimer.

(21) Appl. No.: 10/400,959

(22) Filed: Mar. 27, 2003

(65) Prior Publication Data

US 2004/0191641 A1 Sep. 30, 2004

(51) Int. Cl.
*G03F 9/00* (2006.01)
*G03C 5/00* (2006.01)

(52) U.S. Cl. .................. 430/5; 430/270.1; 430/271.1; 430/275.1; 430/300; 430/302; 430/311; 430/325; 430/330

(58) Field of Classification Search ................ 430/5, 430/270.1, 271.1, 311, 325, 330, 300, 302, 430/275.1
See application file for complete search history.

(56) References Cited

U.S. PATENT DOCUMENTS

| | | |
|---|---|---|
| 5,698,360 A | 12/1997 | Timpe et al. ............... 430/175 |
| 5,700,619 A | 12/1997 | Baumann et al. ........... 430/175 |
| 5,738,013 A | 4/1998 | Kellett ..................... 101/463.1 |
| 5,925,491 A | 7/1999 | Baumann et al. ........... 430/175 |
| 6,341,560 B1 | 1/2002 | Shah et al. ............... 101/463.1 |
| 6,359,056 B1 | 3/2002 | Aurenty et al. ............. 524/556 |
| 6,432,526 B1 | 8/2002 | Arney et al. ................ 428/328 |
| 6,664,027 B1 * | 12/2003 | Griffith et al. .............. 430/311 |
| 6,921,626 B1 * | 7/2005 | Ray et al. ................... 430/311 |
| 2004/0191640 A1 | 9/2004 | Ray et al. |
| 2004/0191695 A1 | 9/2004 | Ray et al. |

FOREIGN PATENT DOCUMENTS

| | | |
|---|---|---|
| EP | 1 120 247 | 8/2001 |
| EP | 1 157 825 | 11/2001 |
| EP | 1 157 826 | 11/2001 |
| EP | 1 157 827 | 11/2001 |
| EP | 1 157 828 | 11/2001 |
| EP | 1 211 063 | 6/2002 |
| WO | WO 95 23244 | 8/1995 |
| WO | WO 00 37254 | 6/2000 |
| WO | WO 01 11426 | 2/2001 |
| WO | WO 01 54915 | 8/2001 |
| WO | WO 02 47447 | 6/2002 |

* cited by examiner

*Primary Examiner*—Christopher G. Young
(74) *Attorney, Agent, or Firm*—J. Lanny Tucker

(57) ABSTRACT

The present invention provides a method of forming an image on a printing plate, in which a nanopaste is imagewise ink-jet applied onto a surface of a substrate. The layer is then treated to form an image area. The method is useful in the formation of printing plates and radiation opaque masks.

67 Claims, No Drawings

NANOPASTES AS INK-JET COMPOSITIONS FOR PRINTING PLATES

BACKGROUND OF THE INVENTION

The art of lithographic printing is based on the immiscibility of ink and water. A lithographic printing plate is composed of ink receptive regions, commonly referred to as the "image area," generated on a hydrophilic surface of a substrate. When the surface of the printing plate is moistened with water and printing ink is applied, revealed portions of the hydrophilic surface retain the water and repel the printing ink, and the oleophilic image area accepts the printing ink and repels the water. The printing ink retained on the oleophilic image area may then be transferred to the surface of a material upon which the image is to be reproduced. Typically, the ink is first transferred to an intermediate blanket, which in turn transfers the ink to the desired surface.

Lithographic printing plates typically comprise a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more soluble or less soluble in a developer than an unexposed portion of the coating. A printing plate is generally considered a positive-working plate if, after exposure to radiation, the exposed regions or areas of the radiation-sensitive coating become more soluble and are removed in the developing process to reveal the hydrophilic surface. Conversely, if the exposed regions or areas become less soluble in the developer and the unexposed regions or areas are removed in the developing process, the plate is considered a negative-working plate. In each instance, the undeveloped areas that remain on the plate provide an ink-receptive image, while the revealed regions of the substrate's hydrophilic surface repel ink.

An alternative method for forming an oleophilic image area on a substrate is to imagewise apply an oleophilic composition directly onto the substrate via ink-jet application. A great deal of effort has been expended in attempting to produce an oleophilic ink-jettable composition that has a suitable viscosity and surface tension for effective ink-jet application, low spreadability after application to the substrate, suitable adherence to a substrate after drying and curing, and sufficient durability for commercial printing press use.

For example, European Patent Publication No. 0 503 621 reports a direct method to make lithographic plates by jetting a photocurable composition onto the plate substrate, and then exposing the plate to ultraviolet radiation to harden the image area. An oil-based ink may then be transferred to the image area for printing onto a printing medium. The reported method avoids the need to expose and develop the composition, but still requires a UV curing step to form the image area.

European Patent Application No. 0 591 916 A2 reports a water-based ink having a polymer containing anhydride groups which are thermally cross-linked on the substrate with a hydroxy-functional polymer. This formulation is applied by jetting the formulation (at room temperature) onto a room temperature substrate.

U.S. Pat. No. 4,833,486 discloses a "phase change" type of ink jet composition. The image is produced by jetting the composition at a high temperature, such that the composition solidifies upon contacting the cooler substrate. The ink becomes instantaneously solid rather than remaining a liquid or gel for a period of time prior to drying or curing to form a solid.

Several published applications report compositions that include an oleophilizing compound that reacts with the surface of the substrate. For example, European Published Application No. 1 211 063 reports an ink-jettable composition containing boron, which reacts with the surface of the substrate. European Published Application No. 1 157 827 reports an ink-jet composition including a hydroxyquinoline compound, which reacts with the surface of the substrate. European Published Application No. 1 157 828 reports an ink-jet composition including a 1,3-dicarbonyl group, which reacts with the surface of the substrate European Published Application No. 1 157 826 reports an ink-jet composition including a catechol, a pyrogallol and a salicylic acid, which reacts with the surface of the substrate.

Additional ink-jettable compositions are reported in U.S. Pat. No. 5,688,864, U.S. Pat. No. 5,852,075, U.S. Pat. No. 5,738,013, U.S. Pat. No. 5,688,864, U.S. Pat. No. 5,788,754, U.S. Pat. No. 5,511,477, U.S. Pat. No. 5,312,654, European Patent No. 745,568, Japanese Patent Application No. 08-267902 and European Patent Application Nos. 0 533 168 and 0 003 789.

Despite the significant amount of effort spent developing ink-jettable compositions for printing plate applications, reported compositions tend to suffer from one or more drawbacks. Certain types of compositions tend to spread on the surface of the substrate prior to solidifying the composition by drying or curing. Other compositions lack suitable adherence to substrates after drying or curing. Still other compositions have low resistance to the mechanical stress that plates are subjected to, as well as the chemicals used to clean and treat finished plates. Additionally, many of the polymeric materials commonly employed in ink-jet compositions must be dissolved in organic solvents prior to application using an ink-jet printer. Many organic solvents are being subjected to increased regulation due to environmental considerations. Further, many compositions do not possess a suitable viscosity and/or surface tension to be applied effectively with an ink-jet printer.

SUMMARY OF THE INVENTION

In one embodiment, the present invention comprises a method of forming an image on a substrate, in which a nanopaste is ink-jet applied onto a surface of a substrate and then treated to form an image area. The substrate may be hydrophilic or oleophilic, depending on the desired application.

The substrate may be hydrophilic or oleophilic, depending on the desired application. The substrate may be composed of a metal such as aluminum, a polymeric material, a ceramic material, a stiff paper, or a laminate of materials.

As used herein, the term "nanopaste" refers to a mixture or sol composed of inorganic nanoparticles dispersed in a carrier. The inorganic nanoparticles generally have an average diameter of less than about 50 nm, more particularly less than about 25 nm and even more particularly less than about 15 nm. In one embodiment, the inorganic nanoparticles are composed of metals, such as silver, palladium or combinations thereof.

Suitable carriers depend on the specific nanopaste and the desired application, but generally include organic carriers, aqueous carriers and mixtures of organic and aqueous liquids. In certain embodiments, the nanopaste is an inorganic nanopaste including inorganic nanoparticles in a substantially aqueous carrier. In these embodiments, the carrier may be composed of water or mixtures of water with water-miscible organic solvents such as suitable alcohols.

The inorganic nanoparticles may form a stable dispersion in the carrier at room temperature. Furthermore, the inorganic nanoparticles are sized such that the nanopaste may be ink-jet applied to the substrate, even when containing a high concentration of inorganic nanoparticles. In one embodiment, the inorganic nanoparticles compose between about 0.5 and about 75 w/w % of the nanopaste.

The nanopaste may optionally include additional components, such as dispersing agents, surfactants, binders, humectants, biocides, viscosity builders, colorants, pH adjusters, drying agents, defoamers or combinations thereof.

After ink-jet application to the substrate, the nanopaste may be treated to remove some or all of the carrier to form an image area. Suitable treatment methods include air and oven drying, as well as radiation curing. The image area may also be optionally exposed to a conditioner to increase the ink-receptiveness of the image area.

In another embodiment, the present invention provides a method of making a printing plate, in which a nanopaste is ink-jet applied onto a surface of a hydrophilic substrate. The nanopaste is then treated to form an image area. The image area may then be immersed in a conditioner to enhance the ink-receptiveness of the image area.

In a further embodiment, the present invention provides a method of making a mask. As in preceding embodiments, a nanopaste may be ink-jet applied to a surface of a substrate. The nanopaste may then be treated to form a radiation opaque image area on the substrate. The image area may have an optical density of greater than 2.0, more particularly greater than 2.5, even more particularly, between 2.5 and 3.0.

The nanopaste has several characteristics making it particularly suitable for use in printing plate and mask applications. First, the inorganic nanoparticles may be dispersed in substantially aqueous carriers and do not necessarily need to be soluble or dispersible in substantially organic carriers. Second, the nanopaste has a suitable viscosity and/or surface tension for ink-jet application to a substrate. Third, the nanopaste adheres well to a variety of substrates. Further yet, the inorganic nanopaste may form a durable image with a long life. Still further, the inorganic nanopaste also has suitable optical density for use as a mask, but may also be treated to enhance the ink-receptiveness of the image for use in printing plates.

DETAILED DESCRIPTION

The present invention provides methods of forming images on a substrate for use in variety of applications, including lithographic printing plates and optical masks. An image is formed on the substrate by ink-jet applying a nanopaste onto the substrate. The nanopaste is then treated to form an image area on the substrate.

Suitable substrates for the present invention may vary widely depending upon the desired application and the specific nanopaste employed. Suitable substrates or substrate surfaces may be hydrophilic or oleophilic, and may be composed of metals, polymers, ceramics, stiff papers, or laminates or composites of these materials. Suitable metal supports include aluminum, zinc, titanium and alloys thereof. In one embodiment, the substrate includes aluminum, which may be treated by graining and anodizing and may then be conditioned to produce a hydrophilic surface.

Suitable polymeric supports include polyethylene terephthalate films, polyester, epoxy laminates and photopolymerisable layers of flexographic printing precursors. Such polymeric supports may be coated with hydrophilicity-enhancing components, including alkoxysilanes, aminopropyltriethoxysilane, glycidoxypropyltriethoxysilane and epoxy functional polymers, as well as conventional coating materials used on polyester bases in photographic films. The substrate may be of sufficient thickness to sustain the wear from printing or other desired applications, and be thin enough to wrap around a printing form, typically from about 100 to about 600 μm.

Specific examples of suitable substrates and substrate treatments are provided in Table 1 below:

TABLE 1

| SUBSTRATE | SURFACE TREATMENT | INTERLAYER TREATMENT |
|---|---|---|
| AA | Quartz Grained and Anodized | None |
| EG-PVPA | Electrograined and Anodized | Polyvinyl phosphoric acid |
| PF | Electrograined and Anodized | Sodium dihydrogen phosphate/Sodium fluoride |
| G20 | Electrograined and Anodized | Vinylphosphonic acid/acrylamide copolymer |
| EG-Sil | Electrograined and Anodized | Sodium Silicate |
| DS-Sil | Chemically Grained and Anodized | Sodium Silicate |
| PG-Sil | Pumice Grained and Anodized | Sodium Silicate |
| CHB-Sil | Chemically Grained, Anodized and Silicated | Sodium Silicate |

In Table 1 above, the abbreviation "AA" refers to "as anodized." An aluminum surface is quartz grained and then anodized using DC current of about 8 A/cm$^2$ for 30 seconds in a $H_2SO_4$ solution (280 g/liter) at 30° C.

"EG" means "electrolytic graining." The aluminum surface is first degreased, etched and subjected to a desmut step (removal of reaction products of aluminum and the etchant). The plate is then electrolytically grained using an AC current of 30–60 A/cm$^2$ in a HCl solution (10 g/liter) for 30 seconds at 25° C., followed by a post-etching alkaline wash and a desmut step. The grained plate is then anodized using DC current of about 8 A/cm$^2$ for 30 seconds in a $H_2SO_4$ solution (280 g/liter) at 30° C.

"PVPA" is a polyvinylphosphonic acid. A plate is immersed in a PVPA solution and then washed with deionized water and dried at room temperature.

"PF" means that the substrate has a phosphate fluoride interlayer. The process solution contains sodium dihydrogen phosphate and sodium fluoride. An anodized substrate is treated in the solution at 70° C. for a dwell time of 60 seconds, followed by a water rinse and drying. The sodium dihydrogen phosphate and sodium fluoride are deposited as a layer to provide a surface coverage of about 500 mg/m$^2$.

"G20" is a printing plate substrate described in U.S. Pat. No. 5,368,974, which is incorporated herein by reference.

"Sil" means that an anodized plate is immersed in a sodium silicate solution to coat it with an interlayer. The coated plate is then rinsed with deionized water and dried at room temperature.

"DS" means "double sided smooth." As aluminum oxide plate is degreased, etched or chemically grained, and subjected to a desmut step. The smooth plate is then anodized.

"PG" means "pumice grained." The surface of an aluminum substrate is degreased, etched and subjected to a desmut step. The plate is then mechanically grained by subjecting it to a 30% pumice slurry at 30° C., followed by a post-etching step and desmut step. The grained plate is then anodized using DC current of about 8 A/cm$^2$ for 30 seconds in a $H_2SO_4$ solution (280 g/liter) at 30° C. The anodized plate is then coated with an interlayer of, for example, sodium silicate.

"CHB" means chemical graining in a basic solution. After an aluminum substrate is subjected to a matte finishing process, a solution of 50 to 100 g/liter NaOH is used during graining at 50° C. to 70° C. for 1 minute. The grained plate is then anodized using DC current of about 8 A/cm$^2$ for 30 seconds in a $H_2SO_4$ solution (280 g/liter) at 30° C. The anodized plate is then coated with a silicated interlayer.

The nanopaste of the present invention may be composed of inorganic nanoparticles and a carrier. Examples of suitable inorganic nanoparticles include metal nanoparticles composed of silver, palladium, gold, platinum, nickel, copper or mixtures or alloys of these materials. The inorganic nanoparticles are generally formed by gas evaporation or other known methods, and have an average diameter of less than 50 nm, more particularly less than 25 nm and even more particularly less than 15 nm.

Suitable carriers for use in the nanopaste of the present invention may include aqueous carriers, organic carriers and mixtures of aqueous and organic liquids. In one embodiment, the nanopaste is an inorganic nanopaste composed of inorganic nanoparticles in a substantially aqueous carrier. As used herein, the phrase "substantially aqueous carrier," refers to carriers containing greater than about 50 v/v % water. Examples of suitable substantially aqueous carriers include solutions of 100 v/v % water and mixtures of water and water-miscible organic liquids such as alcohols.

Specific examples of the nanopastes described herein include a silver/palladium sol having a metallic particle average diameter of 11.1 nm, which is supplied in a 5 w/w % solution in water by ANP, Kumho-ri, Buyong-nyeon, Chungwon-Kun, Chungcheongbukdo, Korea. Another example is a silver sol having a metallic particle average diameter of 11.0 nm, which is supplied in a 5 w/w % solution in water by ANP.

At room temperature, the nanopaste acts as a stable aqueous dispersion. Due, in part, to the small size of the inorganic nanoparticles, a relatively large inorganic nanoparticle concentration may be used in the nanopaste while still maintaining a suitable viscosity for ink-jet application onto a substrate. In one embodiment, the nanopaste may be composed of between about 0.5 and about 75 w/w % inorganic nanoparticles. In another embodiment, the nanopaste may be composed of between about 0.5 and about 25 w/w % inorganic nanoparticles. In yet another embodiment, the nanopaste may be composed of between about 0.5 and about 10 w/w % inorganic nanoparticles.

Optionally, the nanopaste may also include a surfactant or other dispersing agent to promote a stable dispersion of the inorganic nanoparticles in the carrier and/or to enhance image resolution of the resulting image area. Examples of suitable dispersing agents include cationic, anionic, amphoteric and non-ionic surfactants. Specific examples include perfluoroalkyl, alkylphenyl, or polysiloxane surfactants. Suitable polysiloxane surfactants include polyether/polysiloxane copolymer, alkyl-aryl modified methyl-polysiloxane and acylated polysiloxane. Other suitable surfactants include sorbitan tristearate, sorbitan monopalmitate, sorbitan triolate, mono glyceride stearate, polyoxyethylene nonylphenyl ether, alkyl di (aminoethyl) glycine, alkyl polyaminoethylglycine hydrochloride, 2-alkyl-n-carboxyethyl-N-hydroxyethyl imidazolinium betaine, and N-tetradecyl-N, N-substituted betaine. Additional surfactants include alkylated surfactants, fluorosurfactants and siliconated surfactants. Examples of these surfactants include sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, polyethylene tricecyl ether phosphate and the like.

Examples of suitable fluorosurfactants also include those having the trademarks ZONYL FSD, ZONYL FSA, ZONYL FSP, ZONYL FSJ, ZONYL FS-62, ZONYL FSK, ZONYL FSO, ZONYL FS-300, ZONYL FSN, and OLIN 10G, all of which are commercially available from E.I. Du Pont De Nemours & Co. Additional examples of suitable fluorosurfactants include those having the trademarks FLUORAD FC-135, FLUORAD FC-129, FLUORAD FC-120, FLUORAD FC-100, FLUORAD FC-170C FLOURAD FC431 and FLUORAD FC-171, all of which are commercially available from 3M, St. Paul, Minn.

Further examples of suitable surfactants include polyether modified poly-dimethyl-siloxane, silicone glycol, polyether modified dimethyl-polysiloxane copolymer, and polyether-polyester modified hydroxy functional polydimethyl-siloxane.

Optionally, the nanopaste may also include polymeric binders, which may affect the physical and mechanical properties of the nanopaste. Suitable binders may be soluble or dispersible in the carrier used in a particular nanopaste. Such binders may be suitably soluble in organic carriers, aqueous carriers and/or mixtures of organic and aqueous solutions.

Examples of suitable binders include epoxy resins, modified epoxy resins, polyester resins, novolak resins, cellulosic materials, hydroxypropylcellulose, hydroxyethylcellulose, hydroxypropylmethylcellulose, carboxymethylcellulose, copolymers of vinylidene chloride and acrylonitrile, acrylic acid resins, polyvinyl resins, silicone resins, polyamide resins, vinyl alcohol resins, resol resins, acetal resins, polyacrylonitrile resins, formaldehyde resins, polycarbonate resins, polyimide resins, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum and copolymers or derivatives thereof.

Additional examples may include epoxy resins produced by the condensation of epichlorohydrin and Bisphenol A or F, epoxy novolak resins, rubber modified epoxy resins, Bisphenol A based polyester resins, epoxydized o-cresylic novolaks, urethane modified epoxy resins, phosphate modified Bisphenol A epoxy resins, cellulose esters, copolymers of vinylidene chloride and acrylonitrile, poly(meth)acrylates, polyvinyl chloride, silicone resins, polyesters containing hydroxy or carboxy groups, polyamides comprising amino groups or carboxy groups, polymers and copolymers of vinyl alcohol, polyvinylimidazole, polyvinylpyrrolidone, polymers and copolymers of vinylphenol, acrylamide, methylol acrylamide, methylol methacrylamide, polyacrylic acid, methacrylic acid, hydroyethyl acrylate, hydroxethyl methacrylate, maleic anhydride/vinyl methyl ether copolymers, novolak resin, resol resin, polyvinyl phenol resin, copolymers of acrylic acid, polyacetal, poly(methyl methacrylate), polymethacrylic acid, polyacrylonitrile, cellulose acetate, cellulose acetate butyrate, cellulose acetate propionate, melamine formaldehyde resins, polycarbonates, polyimides and urea formaldehyde resins.

Optionally, the nanopaste may also include humectants, biocides, viscosity builders, colorants, pH adjusters, drying agents, defoamers or combinations thereof. Suitable humectants may prevent the inkjet nozzles described below from clogging and/or drying out. Examples of suitable humectants include ethylene glycol and sorbitol. Suitable biocides include Proxel GXL (supplied by Zeneca Corporation), KATHON™ X L (supplied by Rohm and Haas), Triclosan (supplied by Ciba Specialty Chemicals). An example of a suitable viscosity builder includes polyethylene glycol.

The nanopaste may be applied to the substrate by imagewise providing droplets to the surface of the substrate. In one embodiment, imagewise application is performed using ink-jet printing techniques and devices. In this manner, the nanopaste can be applied in a controlled, imagewise fashion to the surface of the substrate by ejecting droplets from a plurality of nozzles or orifices in a print head of an ink jet printer (such as a piezoelectric ink jet printing head).

Generally speaking, imagewise ink-jet application of fluids may be substantially affected by the properties and/or behavior of the fluid. For example, the viscosity and surface tension of an ink-jetted fluid may affect the ink-jet velocity, droplet size, droplet separation length, stream stability and other ink-jetting characteristics of the fluid.

The droplets formed from the nanopaste of the present invention may have a surface tension in the range from 20 to 60 dynes/cm, more particularly from 30 to 50 dynes/cm. The viscosity of the nanopaste may be less than or equal to 20 centipoise, more particularly from 1 to 10 centipoise, more particularly from 1 to 5 centipoise at room temperature. Furthermore, the nanoparticles used in the nanopaste of the present invention are sized such that ink-jet application may be performed without substantial clogging of the ink-jet nozzles or orifices.

Commercially available ink jet printers use various schemes to control the deposition of the nanopaste. Such schemes are generally of two types: continuous stream; and drop-on-demand. In drop-on-demand systems, the fluid droplets are ejected from orifices directly to a position on the support by pressure created by, for example, a piezoelectric device, an acoustic device, or a resistive heater controlled in accordance with digital signals. Thus, fluid droplets are not generated and ejected through the orifices of the print head unless they are needed to print pixels. Continuous ink jet printers produce smaller droplet sizes for a generally higher resolution, but the fluids must be conductive because the fluid droplets are selectively deflected between the substrate and a collection reservoir by implementing electrostatic deflectors.

The nanopaste described herein may have characteristics that are compatible with both drop-on-demand and continuous ink-jet systems, such as suitable driving voltages and pulse widths for thermal inkjet printers, suitable driving frequencies of the piezoelectric element for drop-on-demand device or continuous devices, and suitable particle sizes for ejection from nozzles of a variety of shapes and sizes. However, the nanopaste may be particularly suited for use with drop-on-demand ink-jet systems.

Suitable ink-jet printers for imagewise application of the nanopaste may depend on the particular nanopaste composition being used, and generally include the JetPlate ink-jet printer, available from Pisces-Print Imaging Sciences Inc., Nashua, N.H., the Xaarjet Evaluation Kit, Model No. XJ126R supplied by Xaarjet, Cambridge, UK, the Hewlett Packard DeskJet 970 CXI ink jet printer, the Hewlett Packard 540C ink jet printer, the Epson Stylus Color 600 ink jet printer, the Epson 740 ink jet printer, the Epson 800 ink jet printer, the Epson Stylus Color 900 ink jet printer, the Epson Stylus PRO9600 ink jet printer and the Epson Stylus Color 3000 ink jet printer.

The imagewise applied nanopaste may then be treated to remove substantial amounts of the carrier and/or additional components, such as the dispersing agent, to form a durable image area on the substrate. Suitable treatments may include air drying, oven drying and radiation curing. In one embodiment, the layer may be heated in an oven at between about 50° C. and about 200° C. for between about 30 seconds and about two minutes. In another embodiment, the layer may be heated at less than about 100° C. for about 1 minute.

The nanopaste of the present invention may be used in a variety of applications, including printing plates and masks. In one example, a positive working printing plate may be formed by imagewise ink-jet applying the nanopaste to an ink receptive substrate, and treating the nanopaste to form an image area. Alternatively, a negative working printing plate may be formed by imagewise ink-jet applying the nanopaste onto a hydrophilic substrate, treating the nanopaste to form an image area and then immersing the image area in a suitable conditioner to enhance the ink-receptive properties of at least part of the image area. An example of a suitable conditioner is reported in WO 90/03600 and is provided in the table below:

| Component | Amount |
| --- | --- |
| Water | 1000 ml |
| ETHOQUAD C25 cationic emulsifier | 6.0 g |
| Phenylmercaptotetrazole | 2.8 g |
| Cetyltrimethyl ammonium bromide | 1.5 g |
| Sodium ferric EDTA | 40.0 g |
| Potassium iodide | 5.5 g |
| Potassium thiocyanate | 1.0 g |
| Acetic acid | 20.0 ml |
| Sodium acetate | quantity resulting in pH of 4.0 |

In another example, the nanopaste may be used to form a negative working mask. The nanopaste may be imagewise ink-jet applied to a transparent substrate, such as a polyester substrate, and may then be treated to form a radiation opaque image area. The resulting image area may exhibit an optical density ($d_{max}$) of greater than about 2.0, more particularly greater than about 2.5, even more particularly about 2.8. The resulting mask may be used, for example, as a mask for the selective exposure of the radiation sensitive layer of a printing plate.

The significant durability of the nanopaste to radiation exposure may make the present invention particularly suitable for use as a mask in the formation of a flexographic printing plate. Conventional flexographic printing precursors are composed of a flexible, oftentimes transparent, substrate, a photopolymerisable layer, a release layer and a coversheet. After removing the coversheet and release layer, the photopolymerisable layer may be subjected to floodwise UV exposure through a suitable mask. The photopolymerisable layer may also be subjected to a back exposure or backflash step, in which UV exposure occurs through the substrate to expose a portion of the photopolymerisable material immediately adjacent to the substrate. This backflash step may improve the adhesion between the photopolymerisable layer and the substrate, and may also establish the depth of the relief image after development. Following exposure, the photopolymerisable layer may be developed with a suitable developer to form an image.

After development, the printing plate may be post-exposed to ensure that the photopolymerization process has completed. Optionally, the plate may then be subjected to detackification, a post development treatment that may be used if the surface of the photopolymerisable layer is still tacky. Suitable detackification processes include treatment with bromine or chlorine solutions, or with radiation exposure.

In the method of the present invention, the flexographic precursor may be modified by removing the coversheet and release layer to reveal the photopolymerisable layer. The nanopaste may then be imagewise inkjet applied to the photopolymerisable layer by conventional techniques and treated to form a radiation opaque image area. The photopolymerisable layer may then be exposed to UV radiation through the mask, as well as by back exposure to improve adhesion of the photopolymerisable layer to the substrate. The imaged photopolymerisable layer may then be developed to form an image area on the substrate. After development, the flexographic printing plate may be post-exposed and subjected to detackification as described above.

The present invention is further described in the following Examples:

EXAMPLE 1

Ink-Jet Formation of a Printing Plate

Ag sol (20 ml) was decanted into the storage vessel of a JetPlate ink-jet printer available from Pisces-Print Imaging Sciences Inc., Nashua, N.H. The printer included a platten, a PC controlled imaging output device, an imaging head and a signal encoder that controlled the imaging head. The resolution of the printer was set to 710×1440 dpi with EDS screening, without calibration, and the media type was set for paper. An aluminum sheet was placed on the platten. The sheet was passed under the imaging head such that the Ag sol was imagewise applied to the sheet. The sheet was then air dried resulting in an accurate copy of a test image. The resulting image may then be immersed in the conditioner described below for 20 seconds to form an oleophilic image suitable for use in printing plate applications.

| Component | Amount |
| --- | --- |
| Water | 1000 ml |
| ETHOQUAD C25 cationic emulsifier | 6.0 g |
| Phenylmercaptotetrazole | 2.8 g |
| Cetyltrimethyl ammonium bromide | 1.5 g |
| Sodium ferric EDTA | 40.0 g |
| Potassium iodide | 5.5 g |
| Potassium thiocyanate | 1.0 g |
| Acetic acid | 20.0 ml |
| Sodium acetate | quantity resulting in pH of 4.0 |

EXAMPLE 2

Ink-Jet Formation of a Mask

A sample of unsubbed polyester sheet having a thickness of 4 mil was placed on the platten of the JetPlate Printer. An image area was then produced via the ink-jet application and drying steps of Example 1, but with Ag/Pd sol, a nanopaste including a 5 w/w % solution of Ag and Pd particles dispersed in water (available from ANP, Korea). The particles have a mean diameter of 11.1 nm. An optical density test revealed that the resulting image area had a $D_{max}$ of 2.8.

The imaged substrate was then used as a mask in the exposure of a Capricorn Gold positive working printing plate available from Kodak Polychrome Graphics. The plate (460×660×0.3 ml) was UV exposed for 600 seconds through the mask using a conventional OLIX lightframe available from OLEC Corporation, Irvine, Calif. The imaged plate was then processed in a Mercury Mark V processor, available from Kodak Polychrome Graphics, using Goldstar developer at a processing speed of 1500 mm/minute at 24.5° C. The areas of the coating exposed to the UV light were dissolved in the developer, but the unexposed areas resisted development. Thus, an accurate copy of the mask image was transferred to the plate.

A second mask sample was used in the exposure of a Vistar 360 negative working plate available from Kodak Polychrome Graphics. The printing plate (460×660×0.3 mm) was UV exposed for 240 seconds through the mask using a conventional OLIX lightframe. The plate was then processed in a Javin PC32 processor, a spray-on processor containing 955 developer, a benzyl alcohol based developer, both available from Kodak Polychrome Graphics. The unexposed areas of the plate coating were dissolved away in the developer, but the exposed areas resisted development.

EXAMPLE 3

Ink-Jet Formation of a Mask For A Flexographic Printing Plate

A Cyrel flexographic printing plate, type 67 HLS, available from E.I. du Pont de Nemours and Company, Wilmington, Del. is obtained. A coversheet and release layer are removed from the plate to expose a photopolymerisable layer over a substrate. A nanopaste composed of Ag/Pd sol is imagewise ink-jet applied onto the photopolymerisable layer and treated to form an image area having regions with an optical density of greater than about 2.0. The plate is then given a back flash exposure of 14 seconds on a Cyrel 3040 light source (also available from Dupont), and is given a top exposure of 2 minutes through the image area without a vacuum. The exposed element is then developed in a Cyrel rotary processor for 6 minutes using a 3:1 (vol/vol) mixture of perclene and butanol. The unexposed areas of the photopolymer layer and the image area are removed to form a relief printing plate. The printing plate is oven dried at 60° C. for one hour and is then simultaneously post exposed and finished in a Cyrel light finishing unit for five minutes. An accurate copy of the desired image is transferred to the plate.

Although the preceding example has not been tested, the experiment described in Example 2 provides a strong indication that the patterning nanopaste of the present invention would function suitably as a mask in the production of a flexographic printing plate. Notably, the UV exposure time of 600 seconds described in Example 2 is significantly more time than normally required to expose a lithographic plate. Because the mask successfully protected desired portions of the plate from UV radiation, it can be concluded that a similar mask would function successfully during the extended exposure time used in exposing flexographic printing plates.

What is claimed is:

1. A method for forming an image on a substrate comprising:
    providing a hydrophilic substrate;
    imagewise ink-jet applying onto a surface of the hydrophilic substrate a nanopaste comprising metal nanoparticles and a carrier; and
    treating the nanopaste to form an ink-receptive image area.

2. The method of claim 1 wherein the substrate comprises a metal, polymeric material, ceramic, stiff paper, or a laminate.

3. The method of claim 1 wherein the substrate comprises aluminum.

4. The method of claim 1 wherein the substrate comprises a transparent material.

5. The method of claim 1 wherein the substrate comprises polyester.

6. The method of claim 1 wherein the substrate comprises a flexographic printing element.

7. The method of claim 1 wherein the substrate comprises a photopolymerisable layer.

8. The method of claim 1 wherein the metal nanoparticles comprise silver, palladium or a mixture of silver and palladium.

9. The method of claim 1 wherein the metal nanoparticles comprise copper, gold, platinum, nickel or combinations thereof.

10. The method of claim 1 wherein the metal nanoparticles have an average diameter of less than about 50 nm.

11. The method of claim 1 wherein the metal nanoparticles have an average diameter of less than about 25 nm.

12. The method of claim 1 wherein the metal nanoparticles have an average diameter of less than about 15 nm.

13. The method of claim 1 wherein the metal nanoparticles have an average diameter of less than about 10 nm.

14. The method of claim 1 wherein the carrier is a substantially organic carrier.

15. The method of claim 1 wherein the carrier is a substantially aqueous carrier.

16. The method of claim 15 wherein the carrier consists essentially of water.

17. The method of claim 15 wherein the substantially aqueous carrier consists essentially of a mixture of water and a water-miscible organic liquid.

18. The method of claim 17 wherein the water-miscible liquid consists essentially of an alcohol.

19. The method of claim 1 wherein the nanopaste comprises metal nanoparticles and a substantially aqueous solution.

20. The method of claim 1 wherein the nanopaste comprises between about 0.5 and about 75 w/w % metal nanoparticles.

21. The method of claim 1 wherein the nanopaste comprises between about 0.5 and about 25 w/w % metal nanoparticles.

22. The method of claim 1 wherein the nanopaste comprises between about 0.5 and about 10 w/w % metal nanoparticles.

23. The method of claim 1 wherein the nanopaste further comprises a dispersing agent.

24. The method of claim 23 wherein the dispersing agent comprises a surfactant.

25. The method of claim 24 wherein the surfactant is a cationic, anionic or amphoteric surfactant.

26. The method of claim 24 wherein the surfactant is a non-ionic surfactant.

27. The method of claim 24 wherein the surfactant comprises a perfluoroalkyl, alkylphenyl, or polysiloxane surfactant.

28. The method of claim 24 wherein the surfactant comprises a polysiloxane polyether, polysiloxane copolymer, alkyl-aryl modified methyl-polysiloxane or acylated polysiloxane.

29. The method of claim 24 wherein the surfactant comprises sorbitan tristearate, sorbitan monopalmitate, sorbitan triolate, monoglyceride stearate or polyoxyethylene nonylphenyl ether.

30. The method of claim 24 wherein the surfactant comprises alkyl di(aminoethyl)glycine, alkyl polyaminoethylglycine hydrochloride, 2-alkyl-n-carboxyethyl-N-hydroxyethyl imidazolinium betaine, or N-tetradecyl-N, N-substituted betaine.

31. The method of claim 23 wherein the nanopaste comprises between about 0.05 to about 15.0 w/w % dispersing agent.

32. The method of claim 23 wherein the nanopaste comprises between about 0.1 to about 5.0 w/w % dispersing agent.

33. The method of claim 1 wherein the nanopaste further comprises a binder.

34. The method of claim 33 wherein the binder is soluble or dispersible in substantially organic carriers.

35. The method of claim 33 wherein the binder is soluble or dispersible in substantially aqueous carriers.

36. The method of claim 33 wherein the binder comprises epoxy resin, modified epoxy resin, polyester resin, novolak resin, cellulose resin, copolymers of vinylidene chloride and acrylonitrile, acrylic resin, polyvinyl resin, silicone resin, polyamide resin, vinyl alcohol resin, resol resin, acetal resin, polyacrylonitrile resin, formaldehyde resin, polycarbonate resin, polyimide resin, or copolymers or derivatives thereof.

37. The method of claim 33 wherein the binder comprises polyvinylpyrrolidone, polyvinyl alcohol, polyvinylimidazole, acrylic acid polymers, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropyimethylcellulose or carboxymethylcellulose.

38. The method of claim 1 wherein the nanopaste is free of binders.

39. The method of claim 1 wherein the nanopaste further comprises a surfactant, humectant, biocide, viscosity builder, colorant, pH adjuster, drying agent, defoamer or a combination thereof.

40. The method of claim 39 wherein the surfactant comprises an alkylated surfactant, fluorosurfactant or siliconated surfactants.

41. The method of claim 39 wherein the surfactant comprises sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, or polyethylene tricecyl ether phosphate.

42. The method of claim 1 wherein treating the layer comprises drying the layer.

43. The method of claim 42 wherein drying the layer comprises air drying the layer.

44. The method of claim 42 wherein drying the layer comprises oven drying the layer.

45. The method of claim 42 wherein drying the layer comprises heating the layer.

46. The method of claim 45 wherein heating the layer comprises heating the layer at between about 50 and 300° C.

47. The method of claim 45 wherein heating the layer comprises heating the layer at between about 100 and 200° C.

48. The method of claim 45 wherein heating the layer comprises heating the layer at less than 100° C.

49. The method of claim 1 comprising enhancing the ink-receptiveness of the image area.

50. The method of claim 1 comprising applying a conditioner to the image area to enhance the ink-receptiveness of the image area.

51. A method of forming an image on a hydrophilic substrate comprising:
providing a hydrophilic substrate;
imagewise ink-jet applying onto a surface of the hydrophilic substrate an inorganic nanopaste consisting essentially of metal nanoparticles and a substantially aqueous carrier; and
drying the nanopaste to form an ink-receptive image area.

52. A method of making a printing plate comprising:
providing a hydrophilic substrate;
imagewise ink-jet applying onto a surface of the hydrophilic substrate a nanopaste comprising inorganic nanoparticles and a carrier; and
treating the nanopaste to form an ink-receptive image area.

53. The method of claim 52 wherein treating the layer comprises drying the layer.

54. The method of claim 53 wherein drying the layer comprises air drying the layer.

55. The method of claim 53 wherein drying the layer comprises oven drying the layer.

56. The method of claim 52 comprising applying a conditioner to the image area to increase the ink-receptiveness of the image area.

57. A method of making a mask comprising:
providing a hydrophilic substrate;
imagewise ink-jet applying onto a surface of the hydrophilic substrate a nanopaste comprising metal nanoparticles and a carrier; and
treating the layer to form a radiation opaque, ink-receptive image area.

58. The method of claim 57 wherein the carrier comprises a substantially aqueous carrier.

59. The method of the 57 wherein the inorganic nanoparticles comprise metal nanoparticles.

60. The method of claim 57 wherein the nanopaste is free of binders.

61. The method of claim 57 wherein the treating step comprises drying the layer.

62. The method of claim 57 wherein the treating step comprises heating the layer.

63. The method of claim 57 wherein the treating step comprises drying and heating the layer.

64. The method of claim 57 wherein the image area has an optical density of greater than about 2.0.

65. The method of claim 57 wherein the image area has an optical density of greater than about 2.5.

66. The method of claim 57 wherein the image area has an optical density between about 2.5 and 3.0.

67. A printing plate or mask having a hydrophilic substrate and an ink-receptive image area including inorganic nanoparticles adhered to a surface of the hydrophilic substrate, the printing plate or mask formed by a method comprising the steps of:
providing a hydrophilic substrate;
imagewise ink-jet applying onto a surface of the hydrophilic substrate a nanopaste comprising metal nanoparticles and a carrier; and
treating the nanopaste to form an, ink-receptive image area.

* * * * *